United States Patent
Yudanov

(10) Patent No.: US 11,282,557 B2
(45) Date of Patent: Mar. 22, 2022

(54) MAGNETIC CACHE FOR A MEMORY DEVICE

(71) Applicant: Micron Technology, Inc., Boise, ID (US)

(72) Inventor: Dmitri A. Yudanov, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/908,420

(22) Filed: Jun. 22, 2020

(65) Prior Publication Data

US 2021/0398578 A1 Dec. 23, 2021

(51) Int. Cl.
*G11C 11/16* (2006.01)
*G11C 11/22* (2006.01)

(52) U.S. Cl.
CPC ........ *G11C 11/1659* (2013.01); *G11C 11/161* (2013.01); *G11C 11/1673* (2013.01); *G11C 11/1675* (2013.01); *G11C 11/221* (2013.01); *G11C 11/225* (2013.01)

(58) Field of Classification Search
CPC .............. G11C 11/1659; G11C 11/161; G11C 11/1673; G11C 11/1675; G11C 11/225
USPC ....................................................... 365/158
See application file for complete search history.

(56) References Cited

U.S. PATENT DOCUMENTS

| | | | | |
|---|---|---|---|---|
| 6,587,370 | B2* | 7/2003 | Hirai | G11C 11/15 365/158 |
| 9,443,576 | B1* | 9/2016 | Miller | G11C 11/44 |
| 2003/0090934 | A1* | 5/2003 | Iwata | G11C 11/1657 365/158 |
| 2003/0230733 | A1* | 12/2003 | Tanaka | G01J 5/24 250/553 |
| 2006/0039189 | A1* | 2/2006 | Chen | G11C 11/16 365/158 |
| 2009/0296454 | A1* | 12/2009 | Honda | G11C 11/1659 365/158 |
| 2011/0233695 | A1* | 9/2011 | Li | H01L 43/12 257/421 |
| 2013/0215671 | A1* | 8/2013 | Hsu | G11C 11/1657 365/158 |
| 2016/0035404 | A1* | 2/2016 | Ohki | G11C 11/1675 365/158 |

* cited by examiner

*Primary Examiner* — Sung Il Cho
(74) *Attorney, Agent, or Firm* — Holland & Hart LLP

(57) ABSTRACT

Methods, systems, and devices for a magnetic cache for a memory device are described. Magnetic storage elements (e.g., magnetic memory cells, such as spin-transfer torque (STT) memory cells or magnetic tunnel junction (MTJ) memory cells) may be configured to act as a cache for a memory array, where the memory array includes a different type of memory cells. The magnetic storage elements may be inductively coupled to access lines for the memory array. Based on this inductive coupling, when a memory value is written to or read from a memory cell of the array, the memory value may concurrently be written to a magnetic storage element based on associated current through an access line used to write or read the memory cell. Subsequent read requests may be executed by reading the memory value from the magnetic storage element rather than from the memory cell of the array.

23 Claims, 9 Drawing Sheets

MAGNETIC CACHE FOR A MEMORY DEVICE

BACKGROUND

The following relates generally to one or more systems for memory and more specifically to a magnetic cache for a memory device.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random-access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), not-and (NAND), not-or (NOR), and others. Memory devices may be volatile or non-volatile. Non-volatile memory, e.g., FeRAM, may maintain their stored memory value for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device. Non-volatile memory cells (e.g., NAND memory cells) may maintain their programmed states for extended periods of time even in the absence of an external power source.

DETAILED DESCRIPTION

Figure 1:
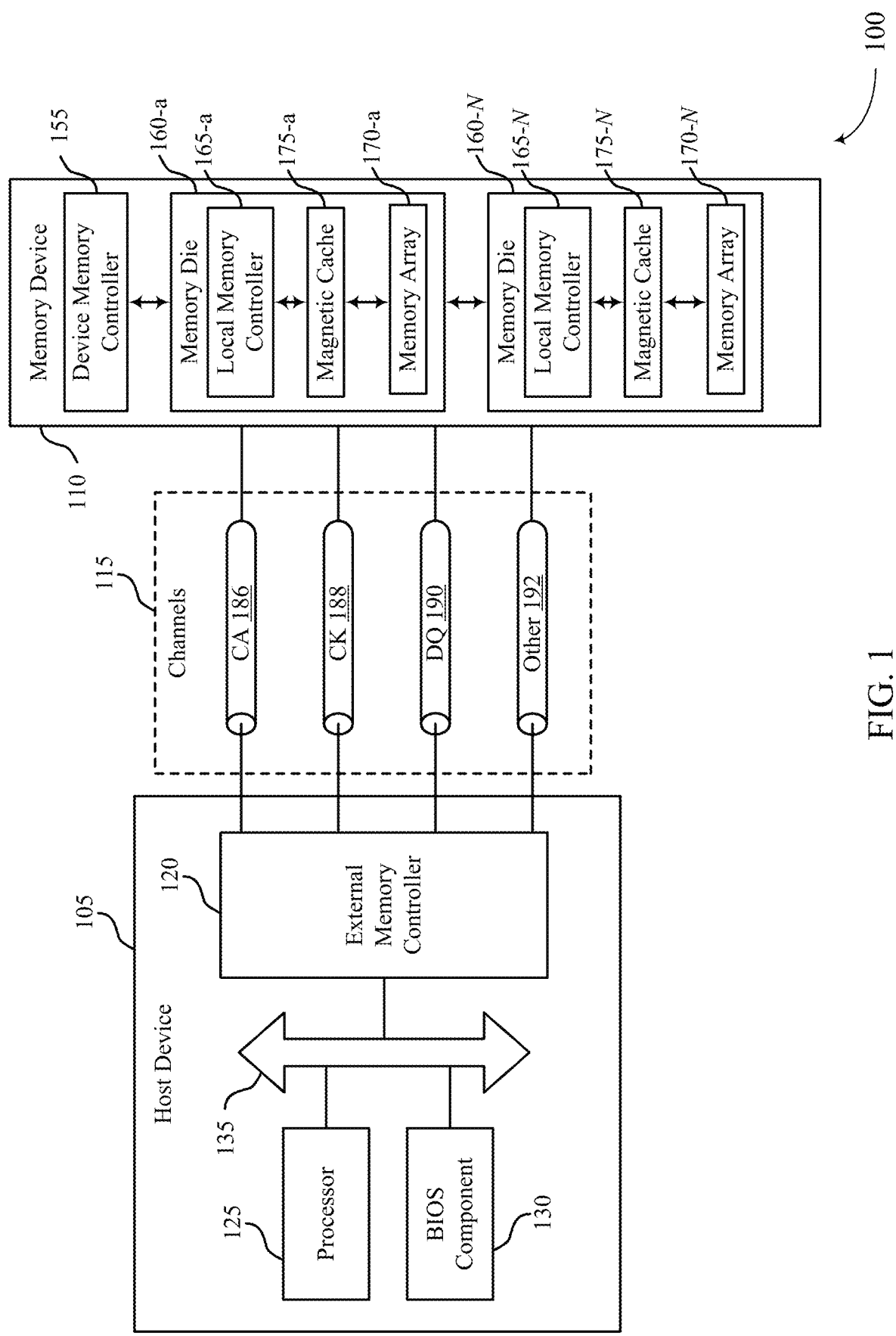
FIG. 1 illustrates an example of a system that supports a magnetic cache for a memory device in accordance with examples as disclosed herein.

Magnetic storage elements (e.g., magnetic memory cells, such as spin-transfer torque (STT) memory cells or magnetic tunnel junction (MTJ) memory cells) may be configured to act as a cache for a memory array, where the memory array includes a different type of memory cells than the associated cache (e.g., the memory array may include capacitive memory cells, such as dynamic random-access memory (DRAM) or ferroelectric memory cells, or floating gate memory cells or replacement gate memory cells including flash NAND (e.g., as used in solid state drives). The magnetic storage elements may be inductively coupled to access lines for the memory array (e.g., selectively, based on respective enable signals). Based on this inductive coupling, when a memory value is written to or read from a memory cell of the array, the memory value may concurrently be written to an enabled magnetic storage element based on associated current through an access line for the memory cell. Subsequent read requests may be executed by reading the memory value from the magnetic storage element rather than from the memory cell of the array.

In some cases, the magnetic storage elements may be arranged as a second memory array, with columns of magnetic storage elements inductively couplable with each bit line of the memory array, and rows of magnetic storage elements spanning multiple bit lines of the memory array. Rows of magnetic storage elements may be enabled or disabled concurrently based on enable lines, where each row of magnetic storage elements may be coupled with a common enable line. Data written to a row of memory cells in the main array thus may concurrently be written to a row of magnetic storage elements. Further, such data may thereafter be read from the row of magnetic storage elements, without accessing the row of memory cells. In some cases, data may be written to a row of memory cells in the array and to a first row of magnetic storage elements, potentially concurrent with data previously written to either the same or a different row of memory cells being read from a second row of magnetic storage elements. That is, data may be written to or read from magnetic storage elements independent of and in some cases optionally concurrent with write operations for associated memory cells and other magnetic storage elements.

Such structures and techniques as described herein may thus provide for using magnetic storage elements as a cache for a main memory array. Further, such structures and techniques as described herein may provide latency or power consumption benefits (e.g., due to the magnetic storage elements supporting lower latency reads or reduced power consumption relative the memory cells of the array), data retention benefits (e.g., due to the magnetic storage elements being non-volatile), or other benefits that may be appreciated by one of ordinary skill in the art.

Features of the disclosure are initially described in the context of systems and dies as described with reference to FIGS. 1-2. Features of the disclosure are described in the context of a junction and circuits as described with reference to FIGS. 3-5. These and other features of the disclosure are further illustrated by and described with reference to an apparatus diagram and flowcharts that relate to a magnetic cache for a memory device as described with reference to FIGS. 6-9.

FIG. 1 illustrates an example of a system 100 that supports a magnetic cache for a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of ROM, flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-$a$, local memory controller 165-$b$, local memory controller 165-N) and a memory array 170 (e.g., memory array 170-$a$, memory array 170-$b$, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package. In some cases, multiple memory dies 160 may be stacked one upon another within a memory device 170 to form one or more die stacks. In some cases, a magnetic cache 175 and a memory array 170 may be in different memory dies 160 of the same memory stack.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channels 186 may carry a read command with an address of the desired data.

In some examples, a CA channel 186 may include any number of signal paths to decode one or more of address or command data (e.g., eight or nine signal paths).

In some cases, the memory device 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities. The channels 115 may be configured to support communications between the host device 105 and the memory device 110 in accordance with an associated protocol (e.g., to exchange or otherwise communicate control, address, data, and other signals between the memory device 110 and the host device 105). Examples of possible protocols include, but are not limited to, a serial advanced technology attachment (SATA) interface, a UFS interface, an eMMC interface, a peripheral component interconnect express (PCIe) interface, a USB interface, Fiber Channel, Small Computer System Interface (SCSI), Serial Attached SCSI (SAS), DDR, a DIMM interface (e.g., DIMM socket interface that supports DDR), an Open NAND Flash Interface (ONFI), Low Power Double Data Rate (LPDDR), a Non-Volatile Memory Express (NVMe) protocol interface, a Non-Volatile Memory Host Controller Interface Specification (NVMHCIS), and the like.

In some examples, a memory die 160 may include a set of magnetic storage elements (e.g., magnetic memory cells, such as STT memory cells or MTJ memory cells), which may be configured to act as a magnetic cache 175 for a corresponding memory array 170, where the memory array 170 includes a different type of memory cells (e.g., capacitive memory cells, such as DRAM or ferroelectric memory cells, or other types of memory cells such as floating gate memory cells or replacement gate memory cells including flash NAND memory cells) than the magnetic cache 175. The magnetic storage elements of the magnetic cache 175 may be inductively coupled to access lines for the memory array 170 (e.g., selectively, based on respective enable signals). Based on this inductive coupling, when a memory value is written to or read from a memory cell of the memory array 170, the memory value may concurrently be written to one or more magnetic storage elements of the magnetic cache 175 based on associated current through an access line for the memory cell. Subsequent read requests may be executed by reading the memory value from a magnetic storage element rather than from the memory cell of the memory array 170.

In some examples, the local memory controllers 165 may be configured to process row buffer data for the magnetic caches 175. For example, a local memory controller 165 may act as a cache controller that enables accessing a magnetic cache 175, implementing replacement policy, handling associativity rules, handling a cache tag array, handling tag matching circuitry, and controlling word line drivers and bit line sense amplifiers, among other examples.

Figure 2:
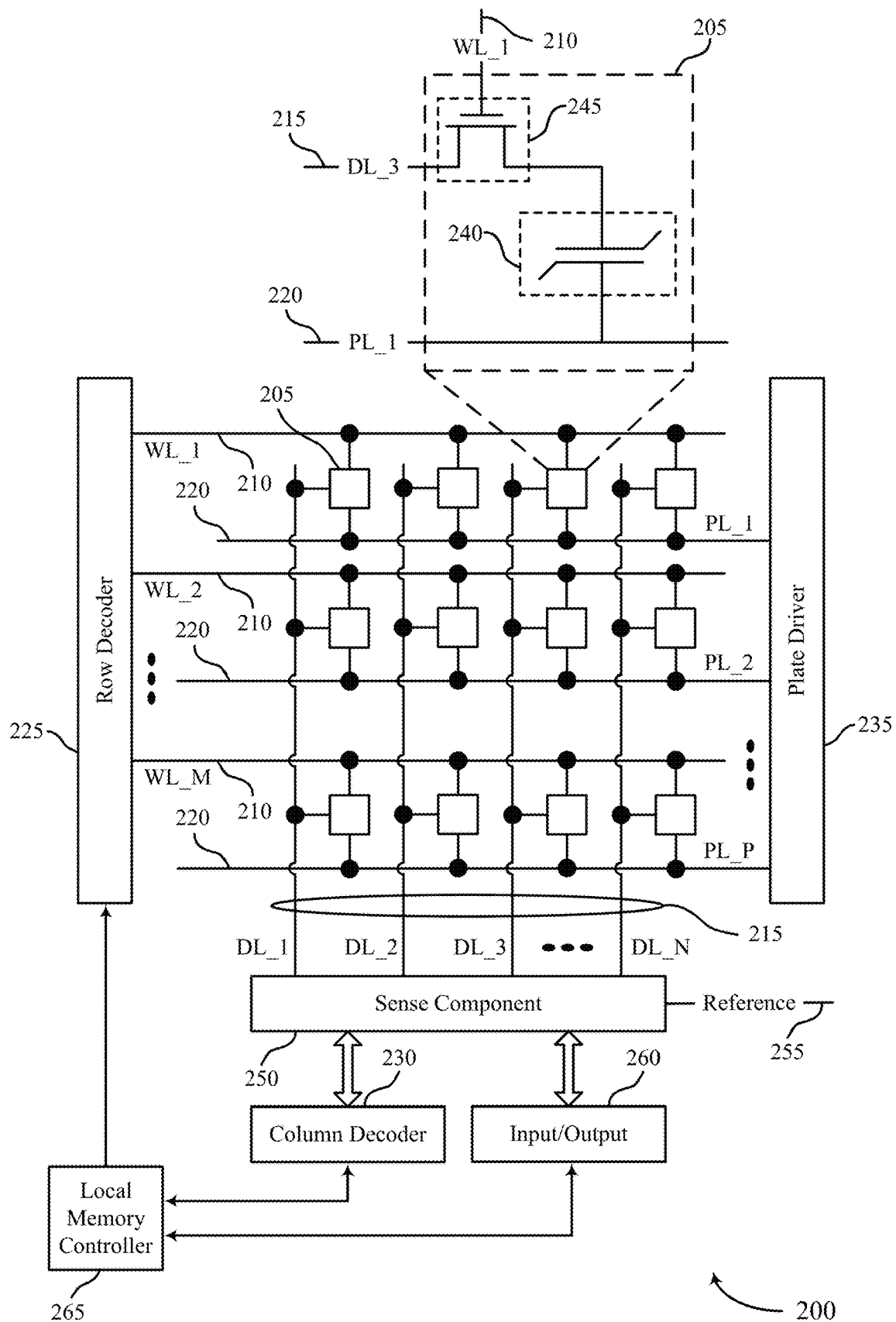
FIG. 2 illustrates an example of a memory die that supports a magnetic cache for a memory device in accordance with examples as disclosed herein.

FIG. 2 illustrates an example of a memory die 200 that may be used in conjunction with a magnetic cache (not shown) in accordance with examples as disclosed herein. The memory die 200 may be an example of a memory die 160 as described with reference to FIG. 1, though only some aspects may be illustrated in FIG. 2 for purpose of focusing the related discussion on those aspects. In some examples, the memory die 200 may be referred to as a memory chip, a memory device, or an electronic memory apparatus.

The memory die 200 may include memory cells 205 that are programmable to store different states such as memory states, which may be referred to herein as memory values. Though the example memory cell 205 illustrated in FIG. 2 may be of a certain type (e.g., ferroelectric memory cells), it is to be understood that the memory cells 205 may be of any type.

In some cases, a memory cell 205 may be programmable to store two memory values, denoted a logic 0 and a logic 1. In some cases, a memory cell 205 may be programmable to store more than two memory values. Additionally or alternatively, a memory cell 205 may be programmable to store a memory state based on an analog or stochastic operation (e.g., related to a neural network), where the memory state correspond to information other than a logic 0 or a logic 1. In some examples, the memory cells 205 may include a capacitive memory element, a ferroelectric memory element, a material memory element, a resistive element, a self-selecting memory element, a thresholding memory element, or any combination thereof. In some examples, a memory cell 205 (e.g., a multi-level memory cell, such as a flash NAND multi-level cell (MLC), tri-level cell (TLC), or quad-level cell (QLC)) may be operable to store more than one bit of information at a time (e.g., a logic 00, logic 01, logic 10, a logic 11). The memory cells 205 may be arranged in an array, such as a memory array 170 described with reference to FIG. 1.

The set of memory cells 205 may be part of a memory section of the memory die 200 (e.g., including an array of memory cells 205), where in some examples a memory section may refer to a contiguous tile of memory cells 205 (e.g., a contiguous set of elements of a semiconductor chip). In some examples, a memory section may refer to the smallest set of memory cells 205 that may be biased in an access operation, or a smallest set of memory cells 205 that share a common node (e.g., a common plate line, a set of plate lines that are biased to a common voltage). Although a single memory section of the memory die 200 is shown, various examples of a memory device in accordance with examples as disclosed herein may have a set of memory sections. In one illustrative example, a memory die 200, or a subsection thereof (e.g., a core of a multi-core memory device, a chip of a multi-chip memory device) may include 32 "banks" and each bank may include 32 sections. Thus, a memory die 200, or subsection thereof, according to the illustrative example may include 1,024 memory sections. In some examples, memory cells 205 may be connected in a serial string (e.g., in a NAND configuration), where the serial string may be coupled with or form part of a bit line 215.

In the example illustrated in FIG. 2, a memory cell 205 may store an electric charge representative of the programmable memory values in a capacitor 240 (e.g., storing charge in a capacitor, capacitive memory element, capacitive storage element). In one example, a charged and uncharged capacitor 240 may represent two memory values, respectively. In another example, a positively charged and negatively charged capacitor 240 may represent two memory values, respectively. In some examples, such as FeRAM architectures, a memory cell 205 may include a capacitor 240 having a ferroelectric material as an insulating (e.g., non-conductive) layer between terminals of the capacitor. Different levels of polarization of the capacitor 240 may represent different memory values (e.g., supporting two or more memory values in a respective memory cell 205). In some examples, ferroelectric materials have non-linear polarization properties.

The capacitor 240 may be an example of a ferroelectric capacitor. The memory cell 205 may further include a switching component 245. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components. In some examples, a switching component 245 may be used as a storage component for the memory cell (e.g., capacitor 240 may not be present). For example, multiple switching components 245 may be connected to each other in serial fashion (e.g., as a string, possibly in a NAND configuration), with different switching components 245 corresponding to (e.g., functioning as) separate storage elements.

In some examples, a memory cell 205 may include a material portion, which may be referred to as a memory element, a memory storage element, a self-selecting memory element, or a self-selecting memory storage element. The material portion may have a variable and configurable electrical resistance or other characteristic that is representative of different memory values. For example, a material that can take the form of a crystalline atomic configuration or an amorphous atomic configuration (e.g., able to maintain either a crystalline state or an amorphous state over an ambient operating temperature range of the memory die 200) may have different electrical resistances depending on the atomic configuration. A more-crystalline state of the material (e.g., a single crystal, a collection of a relatively large crystal grains that may be substantially crystalline) may have a relatively low electrical resistance, and may alternatively be referred to as a "SET" memory value. A more-amorphous state of the material (e.g., an entirely amorphous state, some distribution of relatively small crystal grains that may be substantially amorphous) may have a relatively high electrical resistance, and may alternatively be referred to as a "RESET" memory value. Thus, a voltage applied to such a memory cell 205 may result in different current flow depending on whether the material portion of the memory cell 205 is in the more-crystalline or the more-amorphous state. Accordingly, the magnitude of the current resulting from applying a read voltage to the memory cell 205 may be used to determine a memory value stored by memory cell 205.

In some examples, a memory element may be configured with various ratios of crystalline and amorphous areas (e.g., varying degrees of atomic order and disorder) that may result in intermediate resistances, which may represent different memory values (e.g., supporting two or more memory values in a respective memory cell 205). Further, in some examples, a material or a memory element may have more than two atomic configurations, such as an amorphous configuration and two different crystalline configurations. Although described herein with reference to an electrical resistance of different atomic configurations, a memory device may use some other characteristic of a memory element to determine a stored memory value corresponding to an atomic configuration, or combination of atomic configurations.

In some cases, a memory element in a more-amorphous state may be associated with a threshold voltage. In some examples, electrical current may flow through a memory element in the more-amorphous state when a voltage greater than the threshold voltage is applied across the memory element. In some examples, electrical current may not flow through a memory element in the more-amorphous state when a voltage less than the threshold voltage is applied across the memory element. In some cases, a memory element in a more-crystalline state may not be associated with a threshold voltage (e.g., may be associated with a threshold voltage of zero). In some examples, electrical current may flow through a memory element in the more-crystalline state in response to a non-zero voltage across the memory element.

In some cases, a material in both the more-amorphous state and the more-crystalline state may be associated with threshold voltages. For example, self-selecting or thresholding memory may be based on differences in a threshold voltage of a memory cell between different programmed states (e.g., by way of different compositional distributions). The memory value of a memory cell 205 having such a memory element may be set by biasing or heating the memory element to a temperature profile over time that supports forming a particular atomic configuration, or combination of atomic configurations.

A memory die 200 may include a three-dimensional (3D) memory array, where a plurality of two-dimensional (2D) memory arrays (e.g., decks, levels) are formed on top of one another. In various examples, such arrays may be divided into a set of memory sections, where each memory section may be arranged within a deck or level, distributed across multiple decks or levels, or any combination thereof. Such arrangements may increase the number of memory cells 205 that may be placed or created on a single die or substrate as compared with 2D arrays, which in turn may reduce production costs or increase the performance of a memory die 200, or both. The decks or levels may be separated by an electrically insulating material. Each deck or level may be aligned or positioned so that memory cells 205 may be approximately aligned with one another across each deck, forming a stack of memory cells 205.

The memory die 200 may include access lines (e.g., word lines 210, bit lines 215, and plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, bit lines 215 may be referred to as column lines or digit lines. References to access lines, row lines, column lines, word lines, digit lines, bit lines, or plate lines, or their analogues, are interchangeable without loss of understanding or operation. Memory cells 205 may be positioned at intersections of the word lines 210, the bit lines 215, and/or the plate lines 220. In some examples, bit lines 215 may at least partially extend in a vertical direction (e.g., in a dimension corresponding to die height), such as for example a 3D Flash NAND configuration.

Operations such as reading and writing may be performed on memory cells 205 by activating or selecting access lines such as a word line 210, a bit line 215, and/or a plate line 220. By biasing a word line 210, a bit line 215, and a plate line 220 (e.g., applying a voltage to the word line 210, bit line 215, or plate line 220), a single memory cell 205 may be accessed at their intersection. Activating or selecting a word line 210, a bit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a bit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the bit line 215 using a switching component 245. For example, the capacitor 240 may be isolated from bit line 215 when the switching component 245 is deactivated, and the capacitor 240 may be coupled with bit line 215 when the switching component 245 is activated.

In some cases (e.g., where the memory cell 205 comprises a NAND memory cell), multiple switching components 245 may be arranged in series, each of the switching components 245 corresponding to a different memory cell 205, and selection may be achieved by placing some switching components 245 in bypass mode via their control gates and by sensing a conductivity state for one or more other switching components 245 (which are not placed in bypass mode). In addition, when sensing a conductivity state of a memory cell 205 (e.g., switching component 245) selected in this manner, a search (e.g., scan) for a threshold voltage of the selected memory cell 205 may be performed. For example, a voltage at which a transition occurs from the selected memory cell 205 being in a nonconductive state to being in a conductive state (or vice versa from conductive to nonconductive state) may be used to determine a logic value stored by the memory cell 205.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component. In some architectures, the word line 210 may be in electronic communication with a switching component 245 and the switching component 245 may function as a storage component for the memory cell 205 (e.g., based on an amount of charge that is present or absent from a floating gate included in the switching component 245).

A bit line 215 may be a conductive line that connects the memory cell 205 with a sense component 250. In some architectures, the memory cell 205 may be selectively coupled with the bit line 215 during portions of an access operation. For example, the word line 210 and the switching component 245 of the memory cell 205 may be operable to selectively couple and/or isolate the capacitor 240 of the memory cell 205 and the bit line 215. In some architectures, the memory cell 205 may be in electronic communication (e.g., constant) with the bit line 215.

The sense component 250 may determine a state (e.g., a polarization state or a charge) stored on the capacitor 240 of the memory cell 205 and determine a memory value of the memory cell 205 based on the detected state. The sense component 250 may include one or more sense amplifiers to amplify the signal output of the memory cell 205. The sense component 250 may compare the signal received from the memory cell 205 across the bit line 215 to a reference 255 (e.g., a reference voltage). The detected memory value of the memory cell 205 may be provided as an output of the sense component 250 (e.g., to an input/output 260), and may indicate the detected memory value to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target bit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, an activate operation, an erase operation, or a program operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired memory value. The local memory controller 265 may identify a target memory cell 205 on which to perform the write operation. The local memory controller 265 may identify a target word line 210, a target bit line 215, and a target plate line 220 coupled with the target memory cell 205. The local memory controller 265 may activate the target word line 210, the target bit line 215, and the target plate line 220 (e.g., applying a voltage to the word line 210, bit line 215, or plate line 220) to access the target memory cell 205. The local memory controller 265 may apply a specific signal (e.g., write pulse) to the bit line 215 during the write operation to store a specific state (e.g., charge) in the capacitor 240 of the memory cell 205. The pulse used as part of the write operation may include one or more voltage levels over a duration.

The local memory controller 265 may be operable to perform a read operation (e.g., a sense operation) on one or more memory cells 205 of the memory die 200. During a read operation, the memory value stored in a memory cell 205 of the memory die 200 may be determined. The local memory controller 265 may identify a target memory cell 205 on which to perform the read operation. The local memory controller 265 may identify a target word line 210, a target bit line 215, and target plate line 220 coupled with the target memory cell 205. The local memory controller 265 may activate the target word line 210, the target bit line 215, and the target plate line 220 (e.g., applying a voltage to the word line 210, bit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference 255. Based on that comparison, the sense component 250 may determine a memory value that is stored on the memory cell 205.

In some examples, as described elsewhere herein, a memory device may further include a set of magnetic storage elements (e.g., magnetic memory cells, such as STT memory cells or MTJ memory cells), which may be configured to act as a cache for a memory array such as the example memory array illustrated in FIG. 2. The magnetic storage elements may be inductively coupled to the access lines for the memory array (e.g., selectively, based on respective enable signals). Based on this inductive coupling, when a memory value is written to or read from a memory cell 205, the memory value may concurrently be written to a magnetic storage element based on associated current through an access line for the memory cell 205. Subsequent read requests may be executed by reading the memory value from the magnetic storage element rather than from the memory cell 205.

Figure 3:
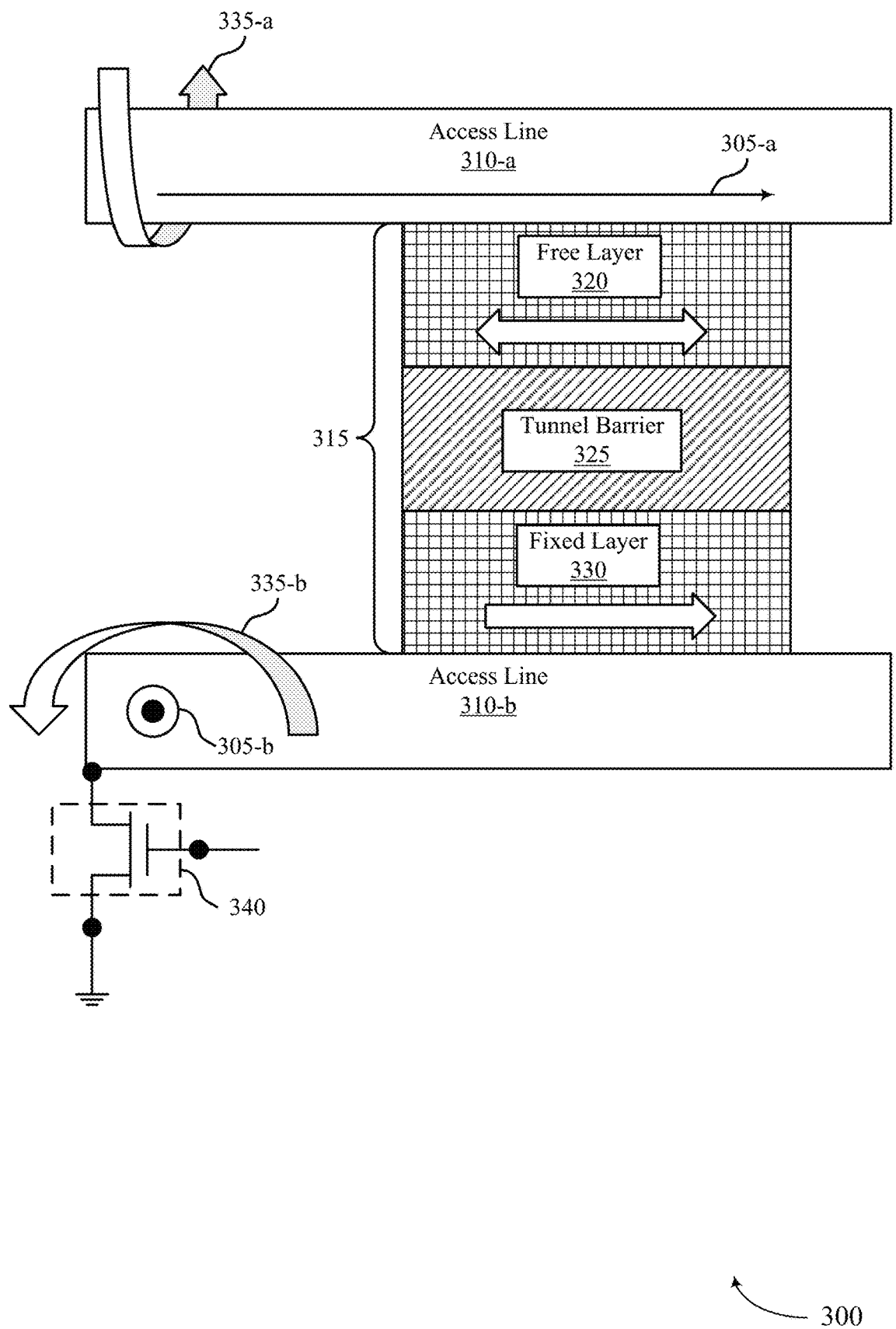
FIG. 3 illustrates an example of a junction that supports a magnetic cache for a memory device in accordance with examples as disclosed herein.

FIG. 3 illustrates an example of a junction 300 that supports a magnetic cache for a memory device in accordance with examples as disclosed herein. The junction 300 may be implemented in a set of magnetic storage elements (e.g., magnetic memory cells, such as STT memory cells or MTJ memory cells), and the set of magnetic storage elements may be configured to act as a cache for a memory array (e.g., a memory array as described with reference to FIG. 2).

The junction 300 may include a pillar 315 for storing a state of the magnetic storage element, where the state of the magnetic storage element may correspond to a memory value (e.g., a logic 1 or a logic 0). The pillar 315 may include a free layer 320, a tunnel barrier 325, and a fixed layer 330. The free layer 320 and the fixed layer 330 may each include a ferromagnetic material (e.g., cobalt-iron-boron (CoFeB) or another ferromagnetic material), and the tunnel barrier 325 may include an insulating material (e.g., magnesium oxide (MgO) or another insulating material). The tunnel barrier 325 may be thin compared to the ferromagnetic layers (e.g., the free layer 320 and the fixed layer 330), and electrons may tunnel through the tunnel barrier 325 from a first ferromagnetic layer to a second ferromagnetic layer. The free layer 320 may be inductively coupled with an access line 310-$a$, which may be an example of an inductive bit line coupled with a memory cell. The fixed layer 330 may be inductively coupled with an access line 310-$b$, which may be an example of an enable line that provides an enable signal for the magnetic storage element that includes the junction 300. As used herein, the term "inductive coupling" may describe a configuration in which a change in the current 305 through an access line 310 may induce a voltage across a ferromagnetic layer (e.g., the free layer 320 or the fixed layer 330) via electromagnetic induction.

The state of the magnetic storage element may be represented by a relationship between a first magnetization direction of the free layer 320 and a second magnetization direction of the fixed layer 330. The second magnetization direction of the fixed layer 330 may be a fixed (e.g., pinned) direction based on coupling the access line 310-*b* to a transistor 340. In some examples, the transistor 340 may be an n-type metal-oxide-semiconductor (nMOS) transistor. The first magnetization direction of the free layer 320 may be parallel or anti-parallel to the second magnetization direction. When the magnetization directions are parallel, electrons may have a high probability of tunneling through the tunnel barrier 325, which may correspond to a low resistance value for the magnetic storage element. When the magnetization directions are anti-parallel, electrons may have a low probability of tunneling through the tunnel barrier 325, which may correspond to a high resistance value for the magnetic storage element. The resistance value (e.g., high resistance or low resistance) may represent the state of the magnetic storage element, and so may correspond to a memory value (e.g., a logic 1 or a logic 0).

The first magnetization direction of the free layer 320 may be switched based on routing a current 305-*a* through the access line 310-*a* (e.g., the inductive bit line). The current 305-*a* may induce an electromagnetic field 335-*a*, which may have a direction counter-clockwise about the direction of the current 305-*a*. Additionally or alternatively, an electromagnetic field 335 about an access line 310 may be a result of one or more effects, which may include a routed current 305 through the access line 310, light effects, quantum effects due to moving particles, or another effect, or any combination thereof. The induced electromagnetic field 335-*a* about the access line 310-*a* may switch the first magnetization direction of the free layer 320 via the inductive coupling. In some examples, a current 305-*b* may be routed through the access line 310-*b* (e.g., the enable line) to enable the inductive coupling between the free layer 320 and the access line 310-*a* or to enable the switch in the first magnetization direction of the free layer 320.

According to the techniques described herein, a current 305-*a* may be routed through the access line 310-*a* as part of an access operation for a memory cell (e.g., a read operation, a write operation, a read-modify-write operation, etc.). When the memory value of the memory cell is read or written, the memory value may be stored in a magnetic storage element based on the magnetization direction of the free layer 320. Thus, when subsequent read requests are received, the memory value of the memory cell may be read based on sensing the resistance value of the magnetic storage element, which may reduce read latency and improve efficiency in a memory device.

Figure 4:
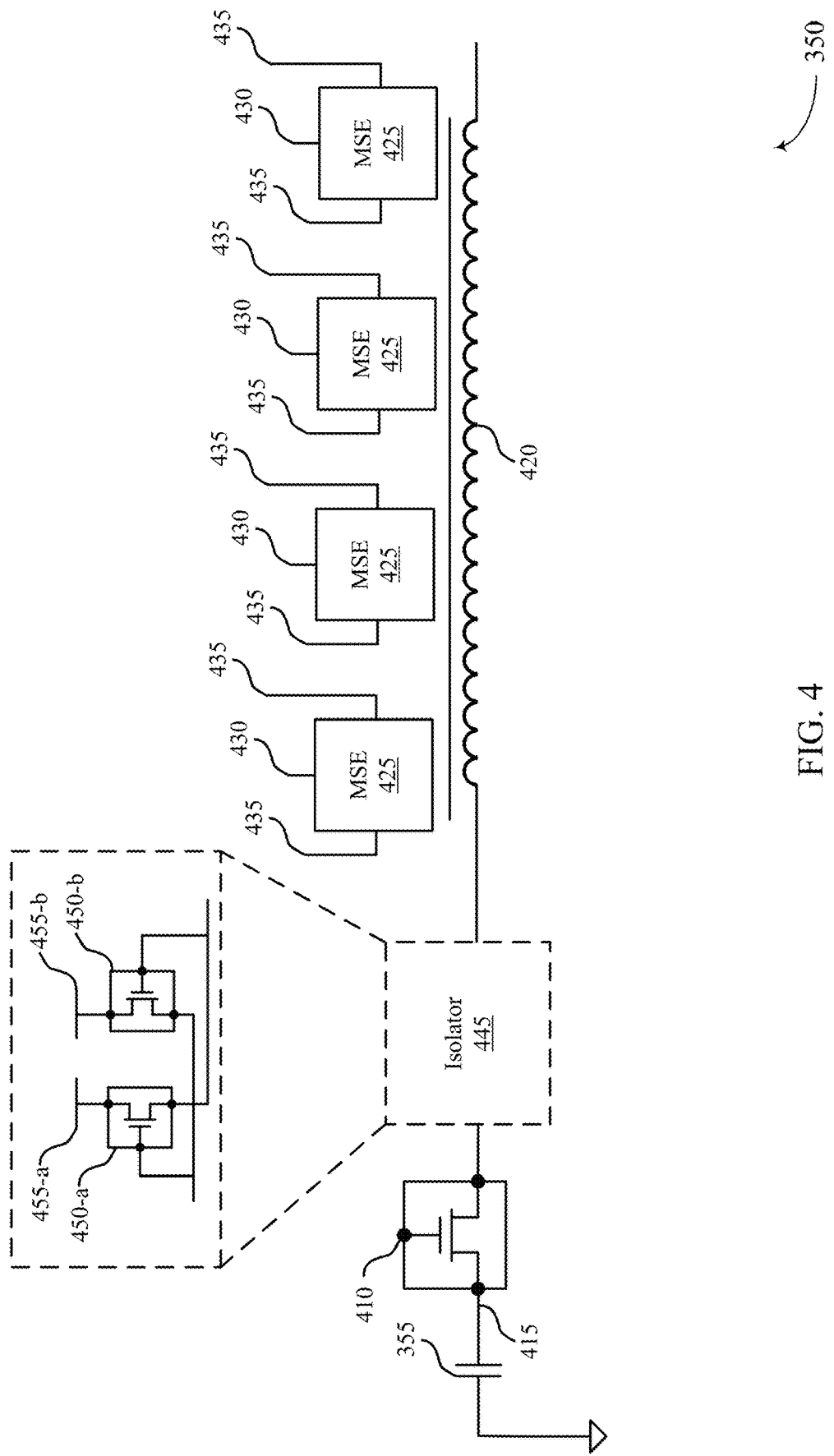
FIG. 4 illustrates an example of a circuit that supports a magnetic cache for a memory device in accordance with examples as disclosed herein.

FIG. 4 illustrates an example of a circuit 400 that supports a magnetic cache for a memory device in accordance with examples as disclosed herein. The circuit 400 may include aspects of a magnetic cache 175 as described with reference to FIG. 1 and aspects of the memory die 200 described with reference to FIG. 2. For example, the circuit 400 may include a memory cell 405, a word line 410, and a bit line 415, which may be examples of corresponding components described with reference to FIGS. 1 and 2.

The memory cell 405 may be coupled with an inductive bit line 420. In some examples, the inductive bit line 420 may be a continuation of the bit line 415. In some examples, the inductive bit line 420 may be enhanced with one or more materials which may be different than those included in the bit line 415 and may provide a greater inductance than the bit line 415.

The inductive bit line 420 may be selectively coupled (e.g., inductively, which as used herein may include coupling via electromagnetic induction) with a set of magnetic storage elements 425. In some examples, each magnetic storage element 425 may be a magnetic memory cell, such as an STT memory cell or an MTJ memory cell. The magnetic storage elements 425 may include aspects of the junction 300 described with reference to FIG. 3. Each magnetic storage element 425 may include an enable node 430. In some examples, activation of the enable node 430 may cause the magnetic storage element 425 to be inductively coupled with the inductive bit line 420, and deactivation of the enable node 430 may cause the magnetic storage element 425 to be decoupled from the inductive bit line 420. Additionally or alternatively, the enable node 430 may enable a state change of the magnetic storage element 425 when the magnetic storage element 425 is inductively coupled with the inductive bit line 420 and when current passes through the inductive bit line 420. In some examples, each magnetic storage element 425 may be coupled with a second inductive bit line (not shown) to provide a magnetic field in a different direction compared to the direction of the magnetic field provided by the inductive bit line 420. In some examples, the second inductive bit line may be an enable line coupled with the enable node 430. The enable line and the inductive bit line 420 may be examples of the access lines 310 described with reference to FIG. 3.

Each magnetic storage element 425 may have an associated state. The magnetic storage element 425 may be programmed to a state associated with a memory value of the memory cell 405, for example based on the magnetic storage element 425 being enabled (e.g., via the enable node 430) while a current is routed through the inductive bit line 420. In some examples, the state of the magnetic storage element 425 may correspond to a resistance value or a conductance value. The resistance value or the conductance value of the magnetic storage element 425 may be sensed via nodes 435, which in some cases may be referred to as R1 and/or R2 nodes.

In some examples, the magnetic storage elements 425 may be configured for write-through caching. That is, when writing a memory value to the memory cell 405 via the inductive bit line 420, a current may flow through the inductive bit line 420, and the memory value may be written to a magnetic storage element 425 based on coupling the magnetic storage element 425 to the inductive bit line 420 while the current flows through the inductive bit line 420, such that the state of the magnetic storage element 425 may come to reflect the memory value. Subsequently, when a read request is received, the memory value may be read from the magnetic storage element 425 rather than from the memory cell 405. Similarly, during a read operation, a current may flow through the inductive bit line 420, and the memory value read from the memory cell 405 (or a complementary memory value) may be stored in the state of the magnetic storage element 425.

In some examples, the circuit 400 may include an isolator 445. The isolator 445 may provide isolation and in some cases partial signal amplification for the circuit 400. In some examples, the isolator 445 may include or be coupled with a sense amplifier for performing isolation and signal reinforcing. The isolator 445 may be configured to enable selective coupling (or decoupling) of the bit line 415 and the inductive bit line 420. The isolator 445 may include transistors 450 coupled to reference voltages 455. For example, a transistor 450-a may be coupled with a reference voltage 455-a associated with read operations of the circuit 400. Similarly, a transistor 450-b may be coupled with a reference voltage 455-b associated with write operations of the circuit 400. In some examples, such as in volatile memory architectures, the isolator 445 may be configured to write back a memory value to the memory cell 405 in an access operation. For example, the isolator 445 may write back the memory value concurrently with routing current to the bit line 415. In the example illustrated in FIG. 4, the isolator 445 may include pull up transistors 450, which may be operable to reinforce a high signal value. In some examples, the isolator 445 may further include pull down transistors (not shown), which may be operable to reinforce a low signal value. In some examples, the isolator 445 may additionally or alternatively include other circuitry operable to provide signal reinforcement (e.g. signal repeaters).

Figure 5:
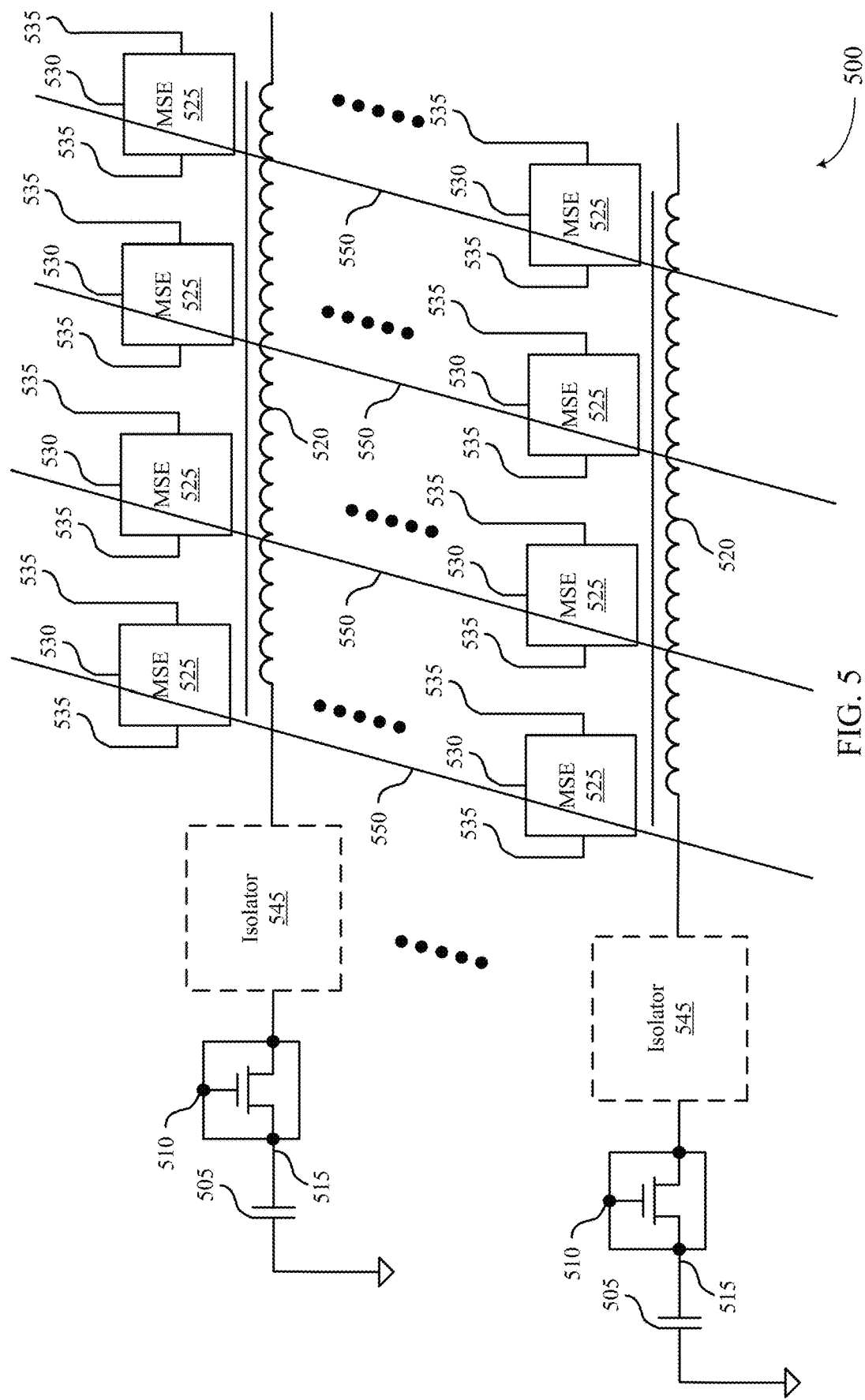
FIG. 5 illustrates an example of a circuit that supports a magnetic cache for a memory device in accordance with examples as disclosed herein.

FIG. 5 illustrates an example of a circuit 500 that supports a magnetic cache for a memory device in accordance with examples as disclosed herein. The circuit 500 may include components of the circuit 400 described with reference to FIG. 4.

Memory cells 505 may be arranged as an array (e.g., as described with reference to FIG. 2). Memory cells 505 may be coupled with respective inductive bit lines 520. In some examples, each inductive bit line 520 may be a continuation of a bit line 515. Each memory cell 505 may additionally be coupled with a respective word line 510.

Each inductive bit line 520 may be selectively coupled with a set of magnetic storage elements 525. In some examples, each magnetic storage element 525 may be a magnetic memory cell, such as an STT memory cell or an MTJ memory cell. The magnetic storage elements 525 may include aspects of the junction 300 described with reference to FIG. 3. Each magnetic storage element 525 may have an associated state. In some examples, the state of the magnetic storage element 525 may correspond to a resistance value. The resistance value of the magnetic storage element 525 may be sensed via a first node 535 and a second node 540, which in some cases may be referred to as R1 and R2 nodes.

Each magnetic storage element 525 may include an enable node 530. Activation and deactivation of the enable nodes 530 may cause the magnetic storage elements 525 to become coupled with or decoupled from enable lines 550. An enable line 550 may enable a row of magnetic storage elements 525 in a magnetic cache, for example based on a current routed through the enable line 550. Each magnetic storage element 525 may be located at an intersection of an enable line 550 and an inductive bit line 520. A magnetic storage element 525 may be selected for an access operation (e.g., a read operation or a write operation) based on activating or selecting a corresponding enable line 550 and a corresponding inductive bit line 520.

In some examples, a first memory value stored in a state of a first magnetic storage element 525 may be read independently and/or concurrently with writing a second memory value to a state of a second magnetic storage element 525. For example, the second memory value may be written to the second magnetic storage element 525 by activating or selecting a corresponding enable line 550 and a corresponding inductive bit line 520. Concurrently, the first memory value stored in the state of the first magnetic storage element 525 may be read based on sensing the resistance value of the first magnetic storage element 525 via nodes 535 of the first magnetic storage element 525, which may be referred to as R1 and/or R2 nodes.

In some examples, rows of magnetic storage elements 525 may be enabled or disabled concurrently using the enable lines 550, where each row of magnetic storage elements 525 may be coupled with a common enable line 550. Data written to a row (or subset thereof) of memory cells 505 in the main array thus may concurrently be written to a row (or subset thereof) of magnetic storage elements 525. Further, such data may thereafter be read from the row of magnetic storage elements 525, without accessing the row of memory cells 505. In some cases, data may be written to a row of memory cells 505 in the array and to a first row of magnetic storage elements 525, potentially concurrent with data previously written to either the same or a different row of memory cells 505 being read from a second row of magnetic storage elements.

In some examples, the nodes 535 may be parallel to the enable lines 550, where memory values stored in magnetic storage elements 525 may be read in sets (e.g., by enabling or disabling rows) along the inductive bit lines 520. Additionally or alternatively, the nodes 535 may be parallel to the inductive bit lines 520, where memory values stored in states of magnetic storage elements 525 may be read in sets along the enable lines 550. In some examples, a magnetic storage element 525 may include a single node 535, and an inductive bit line 520 or an enable line inductively coupled with the magnetic storage element 525 may act as a second node for sensing a resistance value of the magnetic storage element 525 to determine a memory value stored in a state of the magnetic storage element 525. In some examples, one or more nodes 535 may be internally coupled with a gate of an access transistor of a magnetic storage component 525. In examples where the magnetic storage elements 525 may be read in sets, such sets or groups of sets may be mapped to cache associative sets, such as sets of 4-way or 16-way set-associative caches. In some examples, the sets may include storage elements 525 coupled with one or more cache lines (e.g., one or more rows of storage elements 525). Alternatively, a single cache line may include one or more sets.

In some examples, the inductive bit lines 520 of the circuit 500 may collectively be mapped to an array of magnetic storage elements 525 (e.g., according to a many to-one mapping, according to a many-to-many mapping, etc.). In one example, each of the magnetic storage elements 525 may be mapped to a respective subset of the inductive bit lines 520 of the circuit 500. In some examples, such a mapping may be fixed (e.g., where groups or subsets of inductive bit lines 520 are mapped to a respective magnetic storage element 525) which, in some examples, may reduce multiplexing or selection circuit complexity.

In some examples, isolators 545 may provide isolation and partial signal amplification for respective bit lines 515. For example, an isolator 545 may be configured to enable selective coupling (or decoupling) of a bit line 515 and an inductive bit line 520. In some examples, a row of isolators 545 may include a row buffer, which may act as an additional signal development cache for the memory cells 505. In some examples, the isolators 545 may be included in one or more sense components 250 described with reference to FIG. 2.

Figure 6:
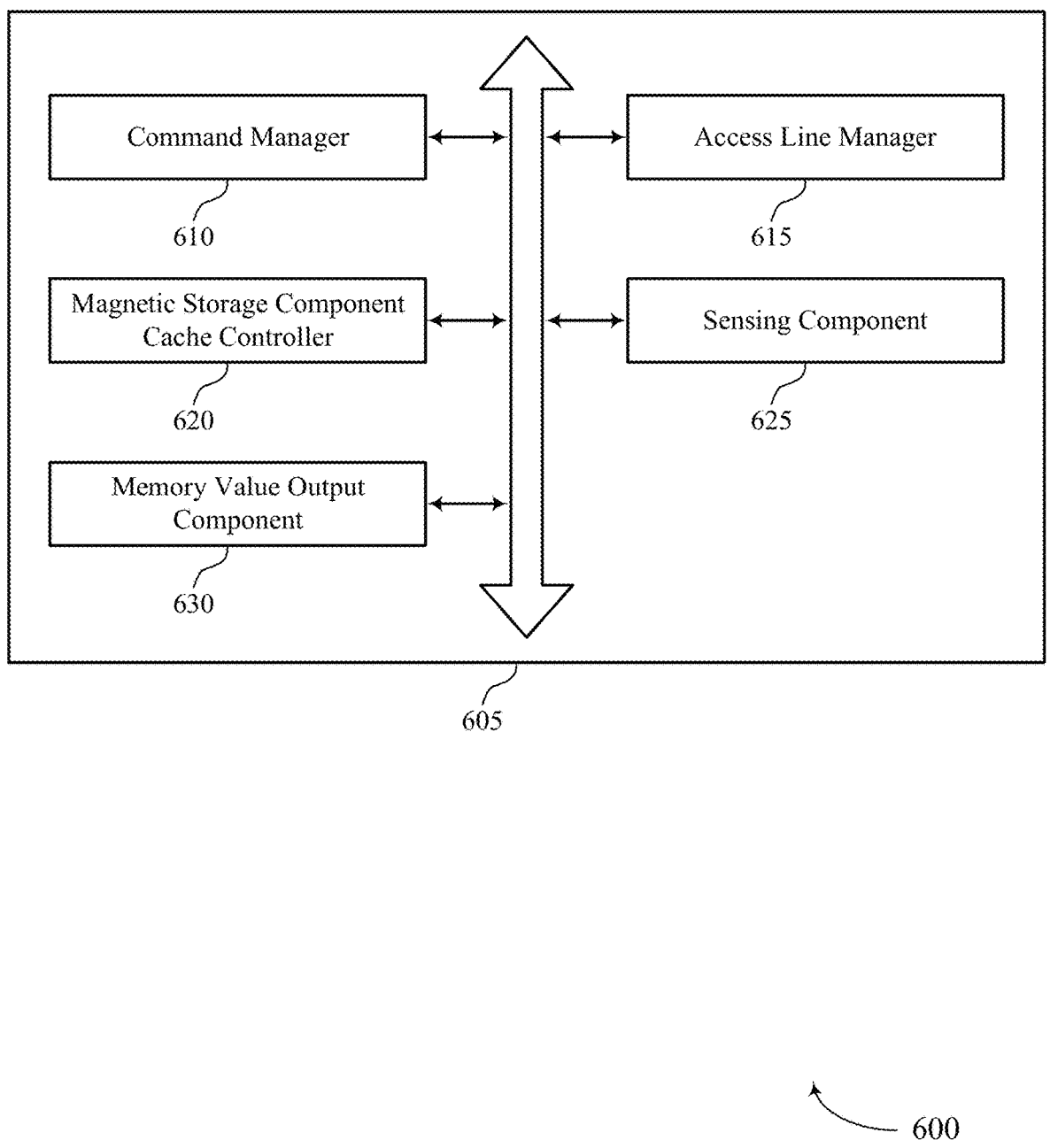
FIG. 6 shows a block diagram of a memory device that supports a magnetic cache for a memory device in accordance with aspects of the present disclosure.

FIG. 6 shows a block diagram 600 of a memory device 605 that supports a magnetic cache for a memory device in accordance with examples as disclosed herein. The memory device 605 may be an example of aspects of a memory device as described with reference to FIGS. 1 and 2. The memory device 605 may include a command manager 610, an access line manager 615, a magnetic storage component cache controller 620, a sensing component 625, and a memory value output component 630. Each of these modules may communicate, directly or indirectly, with one another (e.g., via one or more buses).

In some examples, the command manager 610 may receive a write command associated with a memory cell of an array. In some examples, the command manager 610 may receive, after the write command, a read command associated with the memory cell. In some examples, the command manager 610 may receive, before the write command, a prior write command associated with the memory cell. In some examples, the command manager 610 may receive a read command associated with the prior write command.

In some examples, the access line manager 615 may route a current through an access line for the memory cell based on the write command, where a memory value is written to the memory cell based on the current through the access line. In some examples, the access line manager 615 may decouple the access line from the memory cell after the current is routed through the access line. In some examples, the access line manager 615 may route a prior current through the access line based on the prior write command, where a second memory value is written to the memory cell based on the prior current through the access line.

In some examples, the magnetic storage component cache controller 620 may enable a magnetic storage component concurrent with routing the current through the access line, where the magnetic storage component is programmed to a state corresponding to the memory value based on the magnetic storage component being inductively coupled with the access line while the current is routed through the access line. In some examples, the magnetic storage component cache controller 620 may cause the magnetic storage component to be inductively coupled with the access line. In some examples, the magnetic storage component cache controller 620 may enable the magnetic storage component to change state. In some examples, the magnetic storage component cache controller 620 may enable a second magnetic storage component concurrent with routing the prior current through the access line, where the second magnetic storage component is programmed to a second state corresponding to the second memory value based on the second magnetic storage component being inductively coupled with the access line while the prior current is routed through the access line.

In some examples, the magnetic storage component cache controller 620 may process read and write requests from or to a main memory array based on data availability in a magnetic storage component array. The magnetic storage component cache controller 620 may identify a set index portion of an address in a memory request and locate a cache line within the magnetic storage component array. The cache line may or may not hold the requested data. To determine if the requested data is stored and valid in the magnetic storage component array, the magnetic storage component cache controller 620 may check cache-tag and status bits of the cache line. For example, the magnetic storage component cache controller 620 may check a valid bit to determine if the cache line is valid (or active), and if the cache-tag of the tag field of the address matches the cache-tag of the cache line. If both conditions are met, the magnetic storage component cache controller 620 may identify a cache hit and read or write data from or to the magnetic storage component array based on the memory request. If the status check or tag comparison fails, the magnetic storage component cache controller 620 may identify a cache miss.

On a cache miss, the magnetic storage component cache controller 620 may read a cache line from the main memory array and store the requested data in the magnetic storage component array. If the request is a read request, the magnetic storage component cache controller 620 may forward the cache line (or a part of it) to the requester. In some examples, the magnetic storage component cache controller 620 may also send an acknowledgement request to the requester on a write request (e.g., based on a coherence protocol). If the request is a write request, the magnetic storage component cache controller 620 may perform a write-through operation when both the main memory array and magnetic storage component array are written.

On a cache hit, the magnetic storage component cache controller 620 may read data directly from the magnetic storage component array. To read the requested data, the magnetic storage component cache controller 620 may use the data index field of the address in the memory request to select the requested data in the cache line and forward it to the requester.

In some examples, the sensing component 625 may sense the state of the magnetic storage component based on the second read command. In some examples, the access line manager 615 may maintain the access line as decoupled from the memory cell while the sensing component 625 senses the state of the magnetic storage component. In some examples, the sensing component 625 may sense the state of the magnetic storage component based on the read command. In some examples, the sensing component 625 may sense a resistance of the magnetic storage component. In some examples, the sensing component 625 may sense, concurrent with routing the current through the access line and based on the read command, the second state of the second magnetic storage component.

In some examples, the memory value output component 630 may output the memory value based at least in part the sensed state of the magnetic storage component. In some examples, the memory value output component 630 may output the second memory value based at least in part the sensed second state of the second magnetic storage component.

In some examples, the command manager 610 may receive a first read command associated with a memory cell of an array. In some examples, the command manager 610 may receive, after the first read command, a second read command associated with the memory cell.

In some examples, the access line manager 615 may route a current through an access line for the memory cell based on the first read command, where a memory value is read from the memory cell based on the current through the access line. In some examples, the access line manager 615 may decouple the access line from the memory cell after the current is routed through the access line. In some examples, the access line manager 615 may maintain the access line as decoupled from the memory cell while sensing the state of the magnetic storage component.

In some examples, the magnetic storage component cache controller 620 may enable a magnetic storage component concurrent with routing the current through the access line, where the magnetic storage component is programmed to a state corresponding to the memory value based on the magnetic storage component being inductively coupled with the access line while the current is routed through the access line.

In some examples, the memory value output component 630 may output the memory value based at least in part the sensed state of the magnetic storage component.

Figure 7:
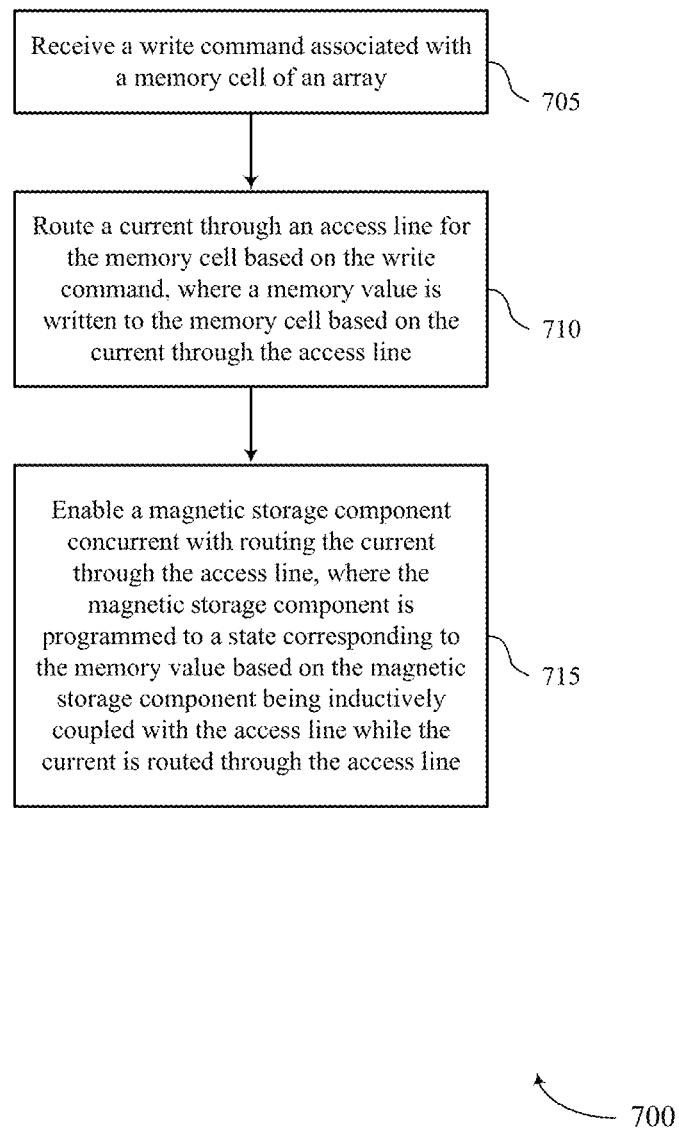
FIGS. 7 through 9 show flowcharts illustrating a method or methods that support a magnetic cache for a memory device in accordance with examples as disclosed herein.

FIG. 7 shows a flowchart illustrating a method or methods 700 that supports a magnetic cache for a memory device in accordance with aspects of the present disclosure. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 705, the memory device may receive a write command associated with a memory cell of an array. The operations of 705 may be performed according to the methods described herein. In some examples, aspects of the operations of 705 may be performed by a command manager as described with reference to FIG. 6.

At 710, the memory device may route a current through an access line for the memory cell based on the write command, where a memory value is written to the memory cell based on the current through the access line. The operations of 710 may be performed according to the methods described herein. In some examples, aspects of the operations of 710 may be performed by an access line manager as described with reference to FIG. 6.

At 715, the memory device may enable a magnetic storage component concurrent with routing the current through the access line, where the magnetic storage component is programmed to a state corresponding to the memory value based on the magnetic storage component being inductively coupled with the access line while the current is routed through the access line. The operations of 715 may be performed according to the methods described herein. In some examples, aspects of the operations of 715 may be performed by a magnetic storage component cache controller as described with reference to FIG. 6.

In some examples, the memory device may enable the magnetic storage component concurrent with routing the current through the access line without writing memory cell at 710. For example, instead of routing current through a part of the access line coupled with the memory cell, the current may be routed via a current sink at an isolator. That is, it may be faster to write data to the magnetic storage component without writing it to the memory cells. In some examples, when data is removed from the magnetic storage component, the data may first be read from the magnetic storage component and then routed to the memory cell (e.g., via the isolator, a driver, an amplifier, etc.), but without enabling the magnetic storage component at 715. In some examples, this may be included in a write-back cache operation.

In some examples, an apparatus as described herein may perform a method or methods, such as the method 700. The apparatus may include features, means, or instructions (e.g., a non-transitory computer-readable medium storing instructions executable by a processor) for receiving a write command associated with a memory cell of an array, routing a current through an access line for the memory cell based on the write command, where a memory value is written to the memory cell based on the current through the access line, and enabling a magnetic storage component concurrent with routing the current through the access line, where the magnetic storage component is programmed to a state corresponding to the memory value based on the magnetic storage component being inductively coupled with the access line while the current is routed through the access line.

Some examples of the method 700 and the apparatus described herein may further include operations, features, means, or instructions for receiving, after the write command, a read command associated with the memory cell, sensing the state of the magnetic storage component based on the read command, and outputting the memory value based at least in part the sensed state of the magnetic storage component.

Some examples of the method 700 and the apparatus described herein may further include operations, features, means, or instructions for decoupling the access line from the memory cell after the current may be routed through the access line, and maintaining the access line as decoupled from the memory cell while sensing the state of the magnetic storage component.

In some examples of the method 700 and the apparatus described herein, sensing the state of the magnetic storage component may include operations, features, means, or instructions for sensing a resistance of the magnetic storage component.

In some examples of the method 700 and the apparatus described herein, enabling the magnetic storage component may include operations, features, means, or instructions for causing the magnetic storage component to be inductively coupled with the access line; or, and enabling the magnetic storage component to change state.

Some examples of the method 700 and the apparatus described herein may further include operations, features, means, or instructions for receiving, before the write command, a prior write command associated with the memory cell, routing a prior current through the access line based on the prior write command, where a second memory value may be written to the memory cell based on the prior current through the access line, enabling a second magnetic storage component concurrent with routing the prior current through the access line, where the second magnetic storage component may be programmed to a second state corresponding to the second memory value based on the second magnetic storage component being inductively coupled with the access line while the prior current may be routed through the access line, receiving a read command associated with the prior write command, sensing, concurrent with routing the current through the access line and based on the read command, the second state of the second magnetic storage component, and outputting the second memory value based at least in part the sensed second state of the second magnetic storage component.

Figure 8:
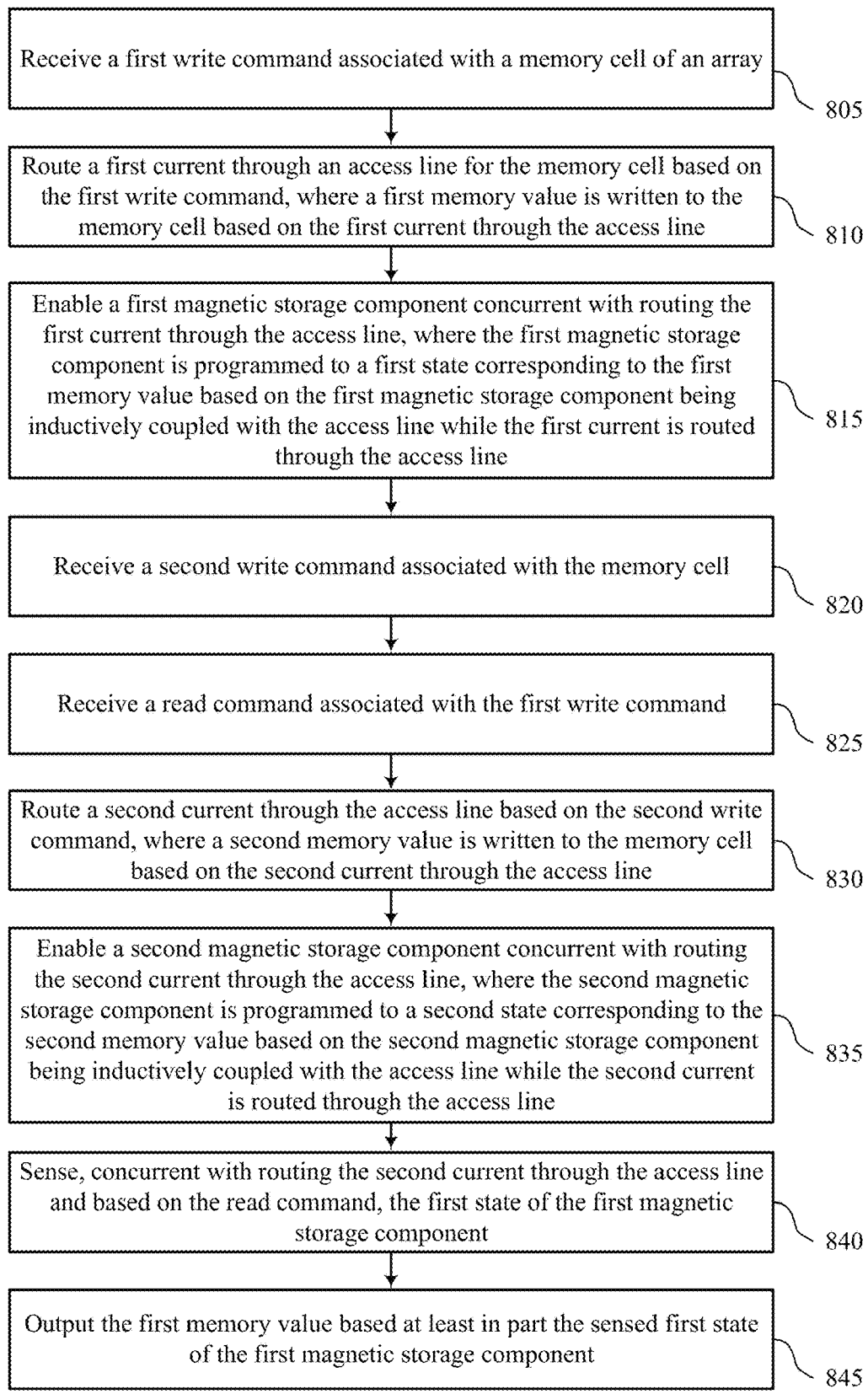

FIG. 8 shows a flowchart illustrating a method or methods 800 that supports a magnetic cache for a memory device in accordance with aspects of the present disclosure. The operations of method 800 may be implemented by a memory device or its components as described herein. For example, the operations of method 800 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 805, the memory device may receive a first write command associated with a memory cell of an array. The operations of 805 may be performed according to the methods described herein. In some examples, aspects of the operations of 805 may be performed by a command manager as described with reference to FIG. 6.

At 810, the memory device may route a first current through an access line for the memory cell based on the first write command, where a first memory value is written to the memory cell based on the first current through the access line. The operations of 810 may be performed according to the methods described herein. In some examples, aspects of the operations of 810 may be performed by an access line manager as described with reference to FIG. 6.

At 815, the memory device may enable a first magnetic storage component concurrent with routing the first current through the access line, where the first magnetic storage component is programmed to a first state corresponding to the first memory value based on the first magnetic storage component being inductively coupled with the access line while the first current is routed through the access line. The operations of 815 may be performed according to the methods described herein. In some examples, aspects of the operations of 815 may be performed by a magnetic storage component cache controller as described with reference to FIG. 6.

At 820, the memory device may receive a second write command associated with the memory cell. The operations of 820 may be performed according to the methods described herein. In some examples, aspects of the operations of 820 may be performed by a command manager as described with reference to FIG. 6.

At 825, the memory device may receive a read command associated with the first write command. The operations of 825 may be performed according to the methods described herein. In some examples, aspects of the operations of 825 may be performed by a command manager as described with reference to FIG. 6.

At 830, the memory device may route a second current through the access line based on the second write command, where a second memory value is written to the memory cell based on the second current through the access line. The operations of 830 may be performed according to the methods described herein. In some examples, aspects of the operations of 830 may be performed by an access line manager as described with reference to FIG. 6.

At 835, the memory device may enable a second magnetic storage component concurrent with routing the second current through the access line, where the second magnetic storage component is programmed to a second state corresponding to the second memory value based on the second magnetic storage component being inductively coupled with the access line while the second current is routed through the access line. The operations of 835 may be performed according to the methods described herein. In some examples, aspects of the operations of 835 may be performed by a magnetic storage component cache controller as described with reference to FIG. 6.

At 840, the memory device may sense, concurrent with routing the second current through the access line and based on the read command, the first state of the first magnetic storage component. The operations of 840 may be performed according to the methods described herein. In some examples, aspects of the operations of 840 may be performed by a sensing component as described with reference to FIG. 6.

At 845, the memory device may output the first memory value based at least in part the sensed first state of the first magnetic storage component. The operations of 845 may be performed according to the methods described herein. In some examples, aspects of the operations of 845 may be performed by a memory value output component as described with reference to FIG. 6.

Figure 9:
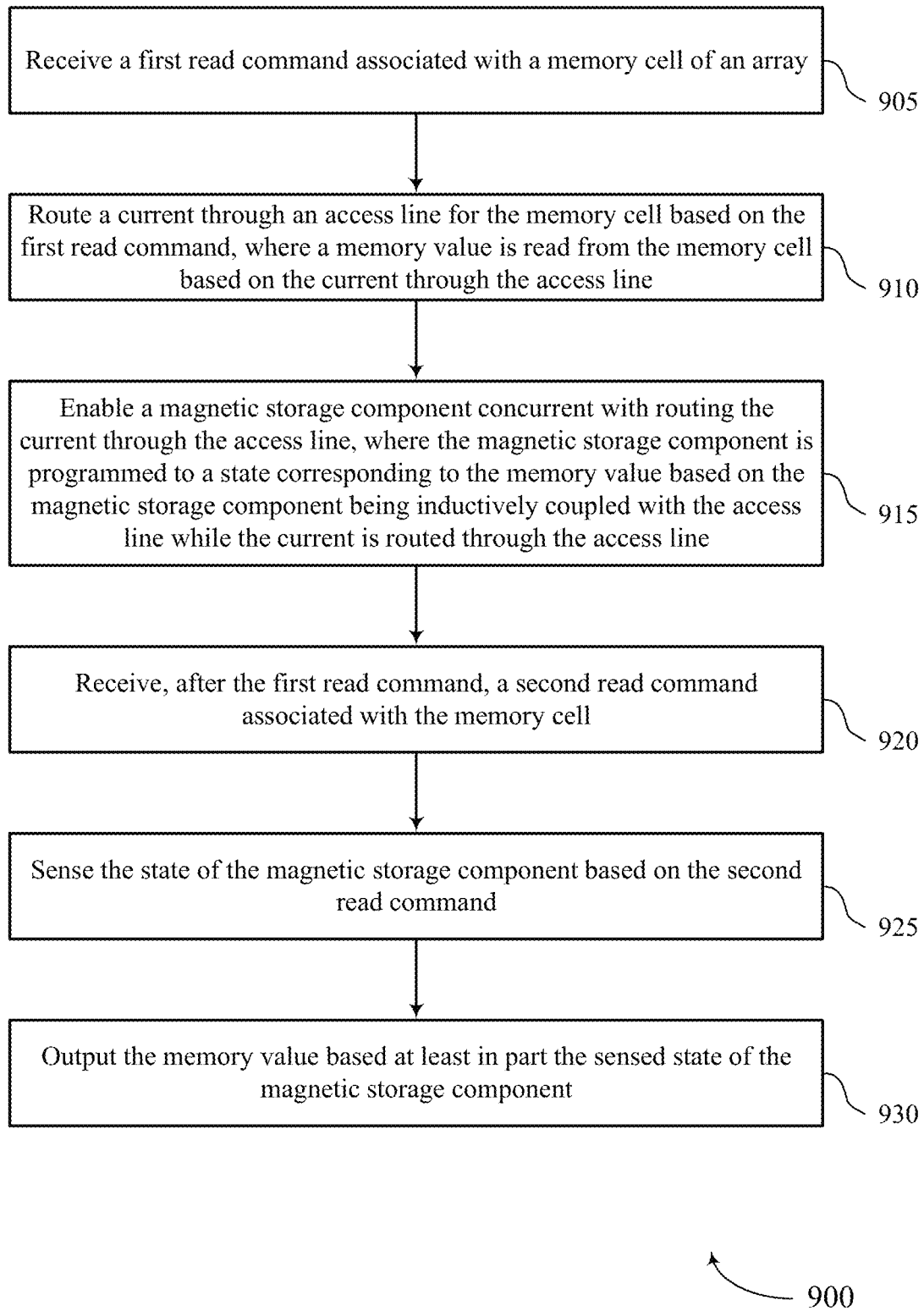

FIG. 9 shows a flowchart illustrating a method or methods 900 that supports a magnetic cache for a memory device in accordance with aspects of the present disclosure. The operations of method 900 may be implemented by a memory device or its components as described herein. For example, the operations of method 900 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 905, the memory device may receive a first read command associated with a memory cell of an array. The operations of 905 may be performed according to the methods described herein. In some examples, aspects of the operations of 905 may be performed by a command manager as described with reference to FIG. 6.

At 910, the memory device may route a current through an access line for the memory cell based on the first read command, where a memory value is read from the memory cell based on the current through the access line. The operations of 910 may be performed according to the methods described herein. In some examples, aspects of the operations of 910 may be performed by an access line manager as described with reference to FIG. 6.

At 915, the memory device may enable a magnetic storage component concurrent with routing the current through the access line, where the magnetic storage component is programmed to a state corresponding to the memory value based on the magnetic storage component being inductively coupled with the access line while the current is routed through the access line. The operations of 915 may be performed according to the methods described herein. In some examples, aspects of the operations of 915 may be performed by a magnetic storage component cache controller as described with reference to FIG. 6.

At 920, the memory device may receive, after the first read command, a second read command associated with the memory cell. The operations of 920 may be performed according to the methods described herein. In some examples, aspects of the operations of 920 may be performed by a command manager as described with reference to FIG. 6.

At 925, the memory device may sense the state of the magnetic storage component based on the second read command. The operations of 925 may be performed according to the methods described herein. In some examples, aspects of the operations of 925 may be performed by a sensing component as described with reference to FIG. 6.

At 930, the memory device may output the memory value based at least in part the sensed state of the magnetic storage component. The operations of 930 may be performed according to the methods described herein. In some examples, aspects of the operations of 930 may be performed by a memory value output component as described with reference to FIG. 6.

In some examples, an apparatus as described herein may perform a method or methods, such as the method 900. The apparatus may include features, means, or instructions (e.g., a non-transitory computer-readable medium storing instructions executable by a processor) for receiving a first read command associated with a memory cell of an array, routing a current through an access line for the memory cell based on the first read command, where a memory value is read from the memory cell based on the current through the access line, enabling a magnetic storage component concurrent with routing the current through the access line, where the magnetic storage component is programmed to a state corresponding to the memory value based on the magnetic storage component being inductively coupled with the access line while the current is routed through the access line, receiving, after the first read command, a second read command associated with the memory cell, sensing the state of the magnetic storage component based on the second read command, and outputting the memory value based at least in part the sensed state of the magnetic storage component.

Some examples of the method 900 and the apparatus described herein may further include operations, features, means, or instructions for decoupling the access line from the memory cell after the current may be routed through the access line, and maintaining the access line as decoupled from the memory cell while sensing the state of the magnetic storage component.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include an array of memory cells, a set of access lines each operable to be coupled with memory cells of the array, and a set of magnetic storage components, where a magnetic storage component of the set is operable to be inductively coupled with an access line of the set, and where the magnetic storage component is operable to change state based on a current through the access line.

In some examples, the magnetic storage component may be operable to change state based on an enable signal for the magnetic storage component being activated concurrent with the current through the access line. In some examples, the magnetic storage component may be operable to be switched, based on an enable signal, between being inductively coupled with the access line and being decoupled from the access line. In some examples, the access line includes a first segment having a first inductance and a second segment having a second inductance greater than the first inductance, where the magnetic storage component may be operable to be inductively coupled with the second segment of the access line. In some examples, the first segment and the second segment include different materials.

Some examples of the apparatus may include a controller operable to cause the apparatus to enable the magnetic storage component concurrent with writing the memory value to the memory cell, where the magnetic storage component may be operable to be programmed to a state corresponding to the memory value based on the magnetic storage component being enabled while the current may be routed through the access line, identify, after writing the memory value to the memory cell, an access command associated with the memory cell, sense the state of the magnetic storage component in response to the access command, and determine the memory value based on sensing the state of the magnetic storage component.

Some examples of the apparatus may include a controller operable to cause the apparatus to, read a memory value from the memory cell based on routing the current through the access line, enable the magnetic storage component concurrent with reading the memory value from the memory cell, where the magnetic storage component may be operable to be programmed to a state corresponding to the memory value based on the magnetic storage component being enabled while the current may be routed through the access line, identify, after reading the memory value from the memory cell, a second read command associated with the memory cell, sense the state of the magnetic storage component in response to the second read command, and determine the memory value based on sensing the state of the magnetic storage component.

Some examples of the apparatus may include an isolation component operable to selectively couple or decouple a first segment of the access line from a second segment of the access line, where the second segment of the access line may be coupled with a selection component for a memory cell of the array. In some examples, the isolation component may be operable to amplify a signal exchanged between the first segment and the second segment, to perform a write-back operation on a memory cell coupled with the access line, or both. In some examples, the isolation component may be operable to store or latch a signal or associated data temporarily within the isolation component.

In some examples, the magnetic storage component may be one of a group of magnetic storage components within the set that may be each operable to be inductively coupled with the access line. In some examples, each of the group of magnetic storage components may be coupled with a respective enable line of a set of enable lines, and where each of the set of enable lines extends in a different direction than the access line. In some examples, each of the set of enable lines may be coupled with a respective row of magnetic storage components that may be operable to be concurrently enabled, and each of the set of access lines may be coupled with a respective group of magnetic storage components that includes one magnetic storage component from each of a set of rows of magnetic storage components.

Some examples of the apparatus may include a controller operable to cause the apparatus to write a first memory value to a memory cell of the array based on the current through the access line, enable the magnetic storage component, concurrent with writing the first memory value to the memory cell, and based on activating the respective enable line for the magnetic storage component, where the magnetic storage component is operable to be programmed to a state corresponding to the first memory value based at least in part on the magnetic storage component being enabled while the current is routed through the access line, and read a second memory value, concurrent with writing the first memory value to the memory cell, from a second magnetic storage component of the group.

In some examples, the set of magnetic storage components includes a cache for the array of memory cells. In some examples, a state of the magnetic storage component corresponds to a resistance of the magnetic storage component. In some examples, the set of magnetic storage components includes spin-transfer torque (STT) memory components. In some examples, the array of memory cells includes memory cells of a first type, and where the set of magnetic storage components includes memory cells of a second type that may be different than the first type.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
an array of memory cells;
a set of access lines each operable to be coupled with memory cells of the array; and
a set of magnetic storage components, wherein a magnetic storage component of the set of magnetic storage components is operable to be inductively coupled with a second segment of an access line of the set of access lines, the access line comprising a first segment having a first inductance and the second segment having a second inductance greater than the first inductance, and wherein the magnetic storage component is operable to change state based at least in part on a current through the access line.

2. The apparatus of claim 1, wherein the magnetic storage component is operable to change state based at least in part on an enable signal for the magnetic storage component being activated concurrent with the current through the access line.

3. The apparatus of claim 1, wherein the magnetic storage component is operable to be switched, based at least in part on an enable signal, between being inductively coupled with the second segment of the access line and being decoupled from the second segment of the access line.

4. The apparatus of claim 1, wherein the first segment and the second segment comprise different materials.

5. The apparatus of claim 1, further comprising:
a controller operable to cause the apparatus to:
write a memory value to a memory cell of the array based at least in part on routing the current through the access line;
enable the magnetic storage component concurrent with writing the memory value to the memory cell, wherein the magnetic storage component is operable to be programmed to a state corresponding to the memory value based at least in part on the magnetic storage component being enabled while the current is routed through the access line;
identify, after writing the memory value to the memory cell, an access command associated with the memory cell;
sense the state of the magnetic storage component in response to the access command; and
determine the memory value based at least in part on sensing the state of the magnetic storage component.

6. The apparatus of claim 1, further comprising:
a controller operable to cause the apparatus to:
identify a first read command associated with a memory cell of the array;
read a memory value from the memory cell based at least in part on routing the current through the access line;
enable the magnetic storage component concurrent with reading the memory value from the memory cell, wherein the magnetic storage component is operable to be programmed to a state corresponding to the memory value based at least in part on the magnetic storage component being enabled while the current is routed through the access line;
identify, after reading the memory value from the memory cell, a second read command associated with the memory cell;
sense the state of the magnetic storage component in response to the second read command; and
determine the memory value based at least in part on sensing the state of the magnetic storage component.

7. The apparatus of claim 1, wherein the magnetic storage component is one of a plurality of magnetic storage components within the set of magnetic storage components that are each operable to be inductively coupled with the second segment of the access line.

8. The apparatus of claim 7, wherein each of the plurality of magnetic storage components is coupled with a respective enable line of a set of enable lines, and wherein each of the set of enable lines extends in a different direction than the access line.

9. The apparatus of claim 8, wherein:
each of the set of enable lines is coupled with a respective row of magnetic storage components that are operable to be concurrently enabled; and
each of the set of access lines is coupled with a respective plurality of magnetic storage components that comprises one magnetic storage component from each of a plurality of rows of magnetic storage components.

10. The apparatus of claim 8, further comprising:
a controller operable to cause the apparatus to:
write a first memory value to a memory cell of the array based at least in part on the current through the access line;
enable the magnetic storage component, concurrent with writing the first memory value to the memory cell, and based at least in part on activating the respective enable line for the magnetic storage component, wherein the magnetic storage component is operable to be programmed to a state corresponding to the first memory value based at least in part on the magnetic storage component being enabled while the current is routed through the access line; and
read a second memory value, concurrent with writing the first memory value to the memory cell, from a second magnetic storage component of the plurality.

11. The apparatus of claim 1, wherein the set of magnetic storage components comprises a cache for the array of memory cells.

12. The apparatus of claim 1, wherein a state of the magnetic storage component corresponds to a resistance of the magnetic storage component.

13. The apparatus of claim 1, wherein the set of magnetic storage components comprises spin-transfer torque (STT) memory components.

14. The apparatus of claim 1, wherein the array of memory cells comprises memory components of a first type, and wherein the set of magnetic storage components comprises memory components of a second type that is different than the first type.

15. An apparatus, comprising:
an array of memory cells;
a set of access lines each operable to be coupled with memory cells of the array;
a set of magnetic storage components, wherein a magnetic storage component of the set of magnetic storage components is operable to be inductively coupled with a second segment of an access line of the set of access lines, the access line comprising a first segment and the second segment, and wherein the magnetic storage component is operable to change state based at least in part on a current through the access line; and
an isolation component operable to selectively couple or decouple the first segment of the access line from the second segment of the access line, wherein the second segment of the access line is coupled with a selection component for a memory cell of the array, and wherein the isolation component is operable to amplify a signal exchanged between the first segment and the second segment, to perform a write-back operation on a memory cell coupled with the access line, or both.

16. A method, comprising:
receiving a write command associated with a memory cell of an array;
routing a current through an access line for the memory cell based at least in part on the write command, the access line comprising a first segment having a first inductance and a second segment having a second inductance greater than the first inductance, wherein a memory value is written to the memory cell based at least in part on the current through the access line; and
enabling a magnetic storage component concurrent with routing the current through the access line, wherein the magnetic storage component is programmed to a state corresponding to the memory value based at least in part on the magnetic storage component being inductively coupled with the second segment of the access line while the current is routed through the access line.

17. The method of claim 16, further comprising:
receiving, after the write command, a read command associated with the memory cell;
sensing the state of the magnetic storage component based at least in part on the read command; and
outputting the memory value based at least in part the sensed state of the magnetic storage component.

18. The method of claim 17, further comprising:
decoupling the access line from the memory cell after the current is routed through the access line; and
maintaining the access line as decoupled from the memory cell while sensing the state of the magnetic storage component.

19. The method of claim 17, wherein sensing the state of the magnetic storage component comprises:
sensing a resistance of the magnetic storage component.

20. The method of claim 16, wherein enabling the magnetic storage component comprises:
causing the magnetic storage component to be inductively coupled with the second segment of the access line; or
enabling the magnetic storage component to change state.

21. The method of claim 16, further comprising:
receiving, before the write command, a prior write command associated with the memory cell;
routing a prior current through the access line based at least in part on the prior write command, wherein a second memory value is written to the memory cell based at least in part on the prior current through the access line;
enabling a second magnetic storage component concurrent with routing the prior current through the access line, wherein the second magnetic storage component is programmed to a second state corresponding to the second memory value based at least in part on the second magnetic storage component being inductively coupled with the access line while the prior current is routed through the access line;
receiving a read command associated with the prior write command;
sensing, concurrent with routing the current through the access line and based at least in part on the read command, the second state of the second magnetic storage component; and
outputting the second memory value based at least in part the sensed second state of the second magnetic storage component.

22. A method, comprising:
receiving a first read command associated with a memory cell of an array;
routing a current through an access line for the memory cell based at least in part on the first read command, the access line comprising a first segment having a first inductance and a second segment having a second inductance greater than the first inductance, wherein a memory value is read from the memory cell based at least in part on the current through the access line;
enabling a magnetic storage component concurrent with routing the current through the access line, wherein the magnetic storage component is programmed to a state corresponding to the memory value based at least in part on the magnetic storage component being inductively coupled with the second segment of the access line while the current is routed through the access line;
receiving, after the first read command, a second read command associated with the memory cell;
sensing the state of the magnetic storage component based at least in part on the second read command; and
outputting the memory value based at least in part the sensed state of the magnetic storage component.

23. The method of claim 22, further comprising:
decoupling the access line from the memory cell after the current is routed through the access line; and
maintaining the access line as decoupled from the memory cell while sensing the state of the magnetic storage component.

* * * * *